(12) United States Patent
Ghosh et al.

(10) Patent No.: US 7,597,135 B2
(45) Date of Patent: Oct. 6, 2009

(54) IMPINGEMENT COOLED HEAT SINK WITH LOW PRESSURE DROP

(75) Inventors: Debashis Ghosh, Williamsville, NY (US); Mohinder Singh Bhatti, Amherst, NY (US)

(73) Assignee: Coolit Systems Inc., Calgary, Alberta (CA)

(*) Notice: Subject to any disclaimer, the term of this patent is extended or adjusted under 35 U.S.C. 154(b) by 452 days.

(21) Appl. No.: 11/439,042

(22) Filed: May 23, 2006

(65) Prior Publication Data

US 2007/0272392 A1 Nov. 29, 2007

(51) Int. Cl.
*F28F 7/00* (2006.01)
*H05K 7/20* (2006.01)

(52) U.S. Cl. .................... 165/80.4; 165/104.33

(58) Field of Classification Search ............... 165/80.4, 165/80.3, 104.33, 104.34, 908; 361/695, 361/697, 699; 257/714
See application file for complete search history.

(56) References Cited

U.S. PATENT DOCUMENTS

| | | | |
|---|---|---|---|
| 3,361,195 A * | 1/1968 | Motto, Jr. et al. ........... 165/80.4 |
| 4,733,293 A | 3/1988 | Gabuzda ..................... 999/81 |
| 5,063,476 A * | 11/1991 | Hamadah et al. ............ 361/697 |
| 5,220,804 A * | 6/1993 | Tilton et al. .................... 62/64 |
| 5,263,536 A * | 11/1993 | Hulburd et al. ............ 165/80.4 |
| 5,304,846 A | 4/1994 | Azar et al. ................... 257/722 |
| 5,597,034 A | 1/1997 | Barker, III et al. ......... 165/80.3 |
| 6,064,572 A * | 5/2000 | Remsburg ................... 361/700 |
| 6,105,373 A * | 8/2000 | Watanabe et al. ............. 62/3.7 |
| 6,196,300 B1 | 3/2001 | Checchetti ................. 164/80.3 |
| 6,219,242 B1 | 4/2001 | Martinez .................... 361/704 |
| 6,366,462 B1 * | 4/2002 | Chu et al. ................... 361/699 |
| 6,719,038 B2 | 4/2004 | Bird et al. .................. 165/80.3 |
| 6,781,834 B2 * | 8/2004 | Nair et al. ................... 361/697 |

* cited by examiner

*Primary Examiner*—Tho v Duong
(74) *Attorney, Agent, or Firm*—Arent Fox LLP

(57) ABSTRACT

Two embodiments of a heat exchanger assembly for cooling an electronic device are shown respectively in FIGS. 1 and 3 and each comprises a housing, a plurality of high fins, a plurality of low fins, a nozzle plate, an inlet, at least one outlet, a primary nozzle, and a plurality of secondary nozzles. In the first embodiment shown in FIG. 1, the housing and the nozzle plate are circular in shape. In the second embodiment shown in FIG. 3, the housing and the nozzle plate are rectangular in shape. Both embodiments include a plurality of secondary nozzles that are aligned outwardly of the primary nozzle and the center axis of the nozzle plate. The secondary nozzles direct the flow of the cooling liquid outwardly of the primary nozzle from the center thus creating an overall system pressure drop lower than that of other assemblies without a plurality of secondary nozzles.

5 Claims, 9 Drawing Sheets

IMPINGEMENT COOLED HEAT SINK WITH LOW PRESSURE DROP

BACKGROUND OF THE INVENTION

1. Field of the Invention

The present invention relates to a heat exchanger for cooling an electronic device.

2. Description of the Prior Art

Electronic devices typically generate a high concentration of heat in the power density range of 5 to 35 W/cm$^2$. Accordingly, research activities have focused on developing more efficient cooling assemblies capable of dissipating the heat generated from such electronic devices while occupying minimal space.

A forced air cooling assembly typically includes a heat exchanger and a heat sink and cools the electronic device by natural or forced convection cooling methods. The electronic device is attached to the heat sink and transfers the heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm$^2$. However, increased computing speeds have resulted in a corresponding increase in the power density of the electronic devices in the order of 20 to 35 W/cm$^2$, thus requiring more effective cooling assemblies.

In response, liquid-cooled cooling assemblies, commonly referred to as liquid cooled units (LCUs) were developed. The LCUs comprise a cold plate, a pump, a heat exchanger, the appropriate piping and a high heat capacity cooling fluid such as water or water-glycol solutions to remove heat from the higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or blower. These types of LCUs are characterized as indirect cooling units since they remove heat from the heat source indirectly by a secondary working fluid. Generally, a single-phase liquid removes heat from the heat sink then dissipates it into the air stream that flows through the remotely located liquid-to-air heat exchanger. Such LCUs are satisfactory for a moderate heat flux of less than 35 to 45 W/cm$^2$. These LCUs require a pumping system to direct the flow of cooling fluid over the heat sink as well as to circulate the fluid. Typically, an overall system pressure drop of 5 psi needs to be generated by these pumping systems. 90% of this pressure drop occurs across the cold plate. Minimizing this pressure drop can dramatically improve the lifetime of the pumping system as well as reduce the number of leaks at the joints of the piping.

The LCUs of the prior art have included an axial inlet for coolant with a diverter to direct the coolant radially outward and into fins or vanes. Examples of such LCUs are illustrated in U.S. Pat. No. 4,733,293 to Gabuzda; U.S. Pat. No. 5,597,034 to Barker, III, et al.; U.S. Pat. No. 6,196,300 to Checchetti; U.S. Pat. No. 6,219,242 to Martinez and U.S. Pat. No. 6,719,038 to Bird et al. Each patent discloses a heat sink assembly having radial fins or vanes and used in an LCU. The heat sink assemblies include a base plate with a plurality of fins extending upwardly from the base plate. In operation, the base plate absorbs the heat from the electronic device and transfers the heat to the fins. A cooling fluid flows past the fins, drawing the heat from the fins, thereby removing the heat from the heat sink. The flow of cooling fluid is directed parallel to the fins by a central diverter.

A significant effort has been made in the prior art to develop the most efficient combination of parameters for attaining the maximum heat transfer with the heat sink and the minimum overall system pressure drop. Such parameters have included the configuration of the fins and the fluid flow paths associated with the fins. The U.S. Pat. No. 5,304,846 to Axar et al. is exemplary of the pursuit if the most effective combination of parameters.

Although the prior art dissipates heat from electronic devices, as computing speeds increase, there is a continuing need for cooling devices having more efficient heat transfer capabilities as well as smaller overall system pressure drops.

SUMMARY OF THE INVENTION AND ADVANTAGES

The invention provides for a heat exchanger assembly for cooling an electronic device comprising a housing, a plurality of high fins, a plurality of low fins, a nozzle plate, an inlet, at least one outlet, a primary nozzle, and a plurality of secondary nozzles. The plurality of secondary nozzles in the nozzle plate is disposed outwardly of the primary nozzle from the center for directing the cooling fluid into a fin chamber outwardly of the primary nozzle from the center. Additionally, a plurality of tertiary nozzles is disposed outwardly of the secondary nozzles for directing the cooling fluid into the fin chamber outwardly of the secondary nozzles.

The liquid pump in a typical LCU is the most complex and expensive component of the system. The lifetime of a pump diminishes significantly as the overall system pressure drop increases. The disposition of the secondary and tertiary nozzles permits effective direction and circulation of the cooling fluid while maintaining a low overall system pressure drop over the assembly. By effectively metering the flow of the various nozzles, higher pressure drop can be concentrated over areas where the highest amount of heat flux exists. Further, the cold cooling fluid can be directed locally at regions of high heat load via the secondary and tertiary nozzles. If the entire amount of cooling fluid is discharged through a single nozzle, a very high pressure drop will be created. A moderate reduction in the total amount of fluid discharged through the lone nozzle results in a significant reduction of pressure drop. Hence, by apportioning the flow between primary, secondary and tertiary nozzles, the overall system pressure drop is reduced while maintaining a high heat transfer coefficient at regions of high heat flux.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
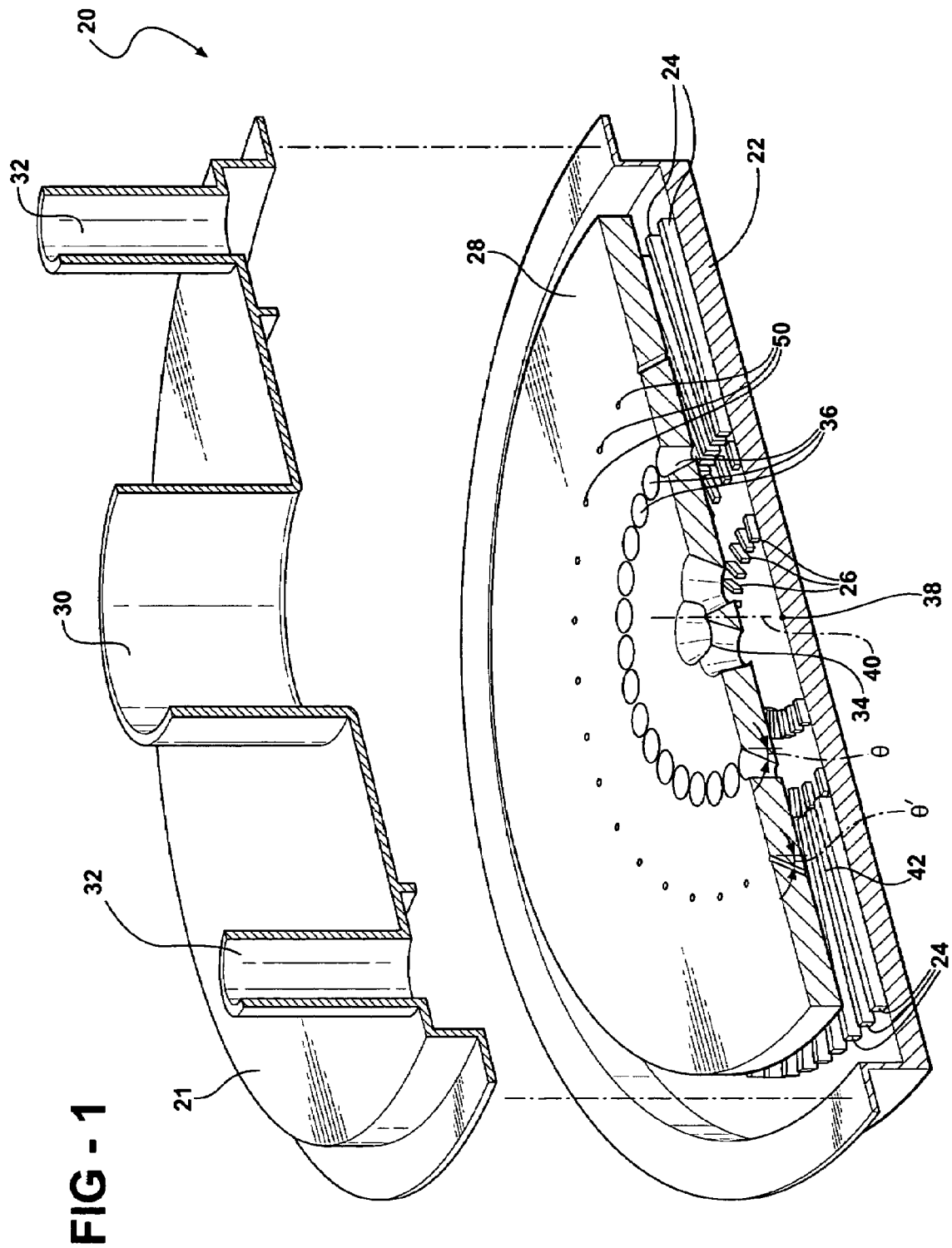
FIG. 1 is an exploded cross-sectional view of a first embodiment of the invention employing a circular housing and nozzle plate.
Figure 2:
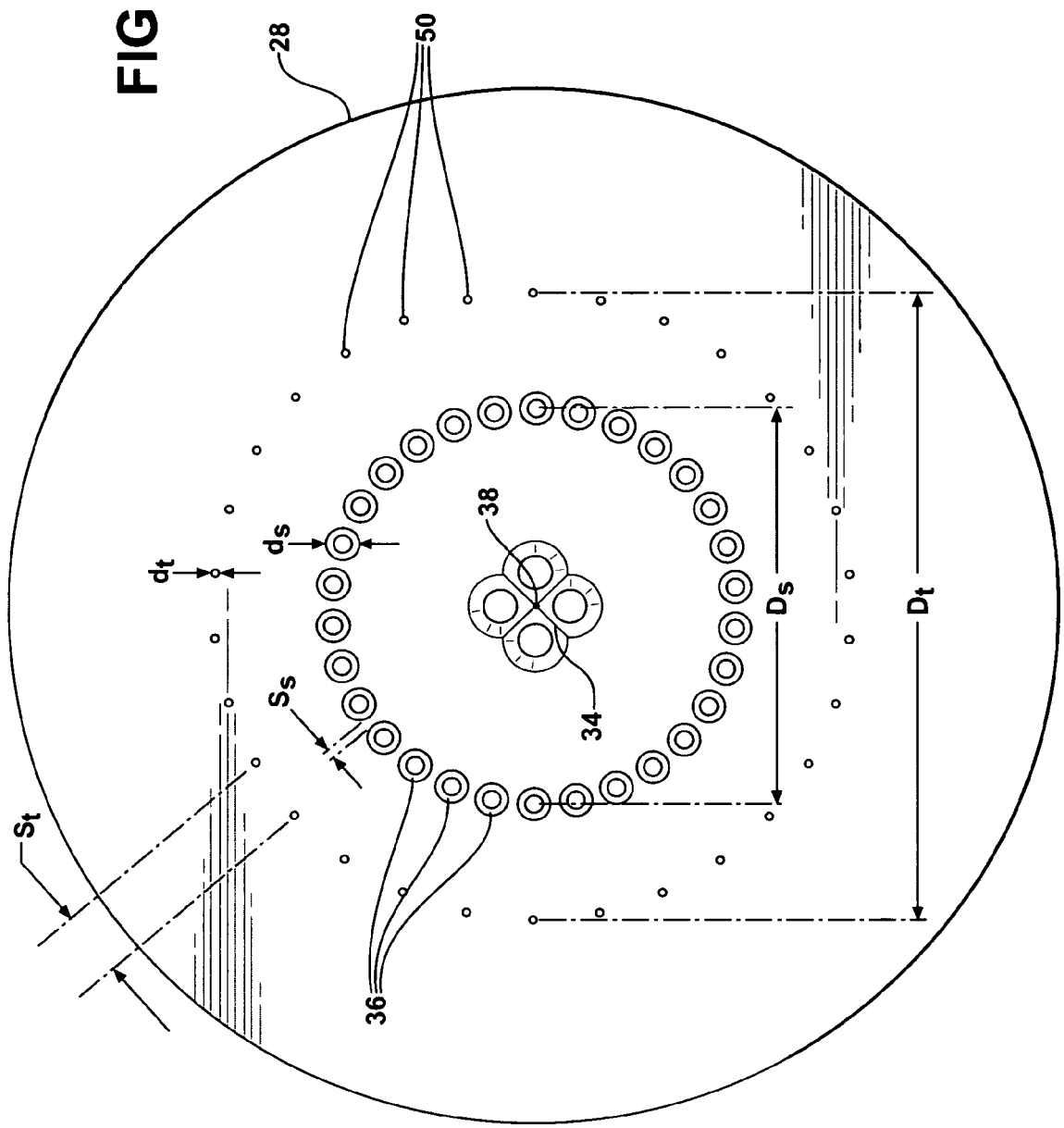
FIG. 2 is a top view of the embodiment of FIG. 1 showing the alignment of the nozzles.
Figure 3:
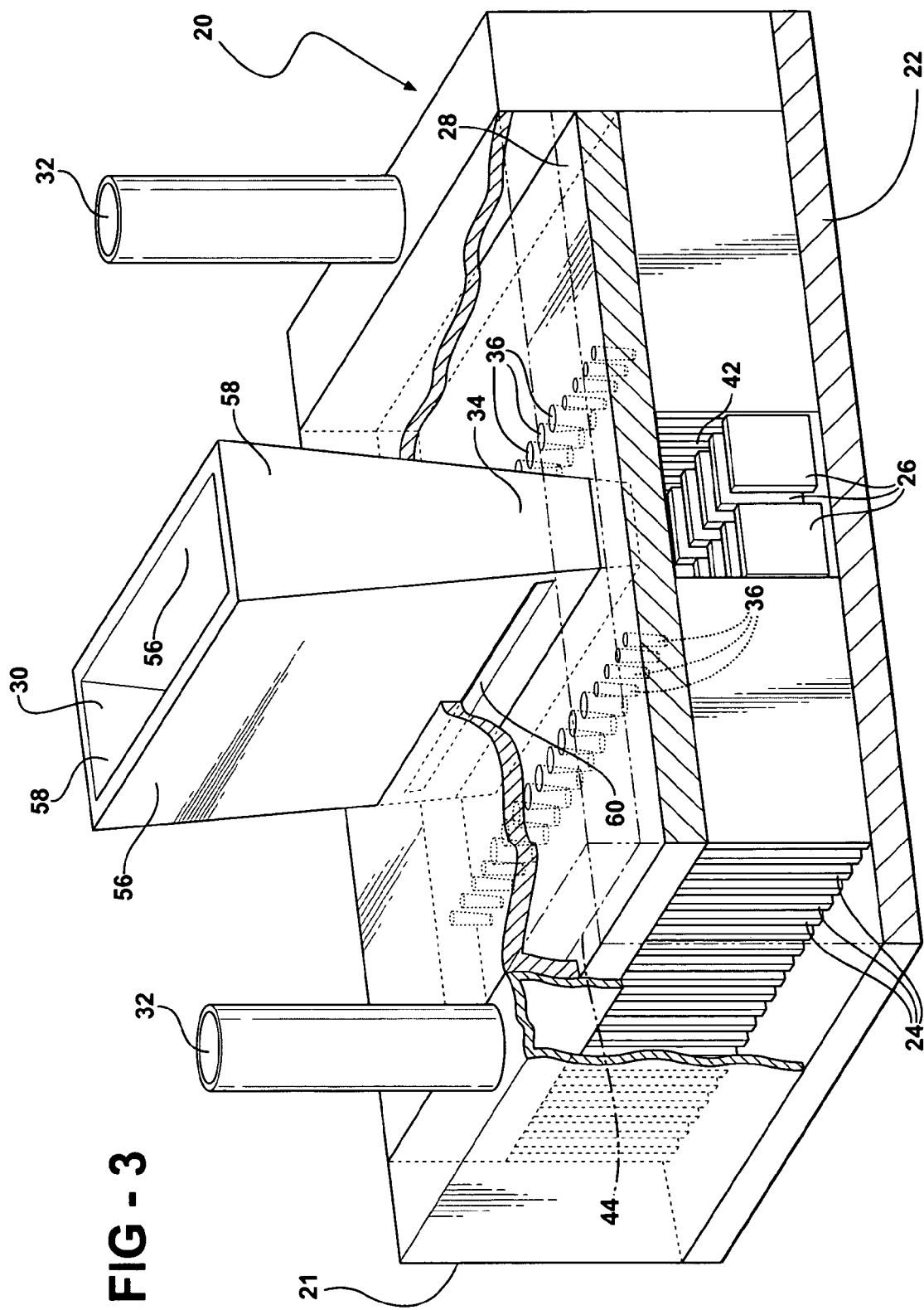
FIG. 3 is a perspective view of a second embodiment of the invention employing a rectangular housing and nozzle plate.
Figure 4:
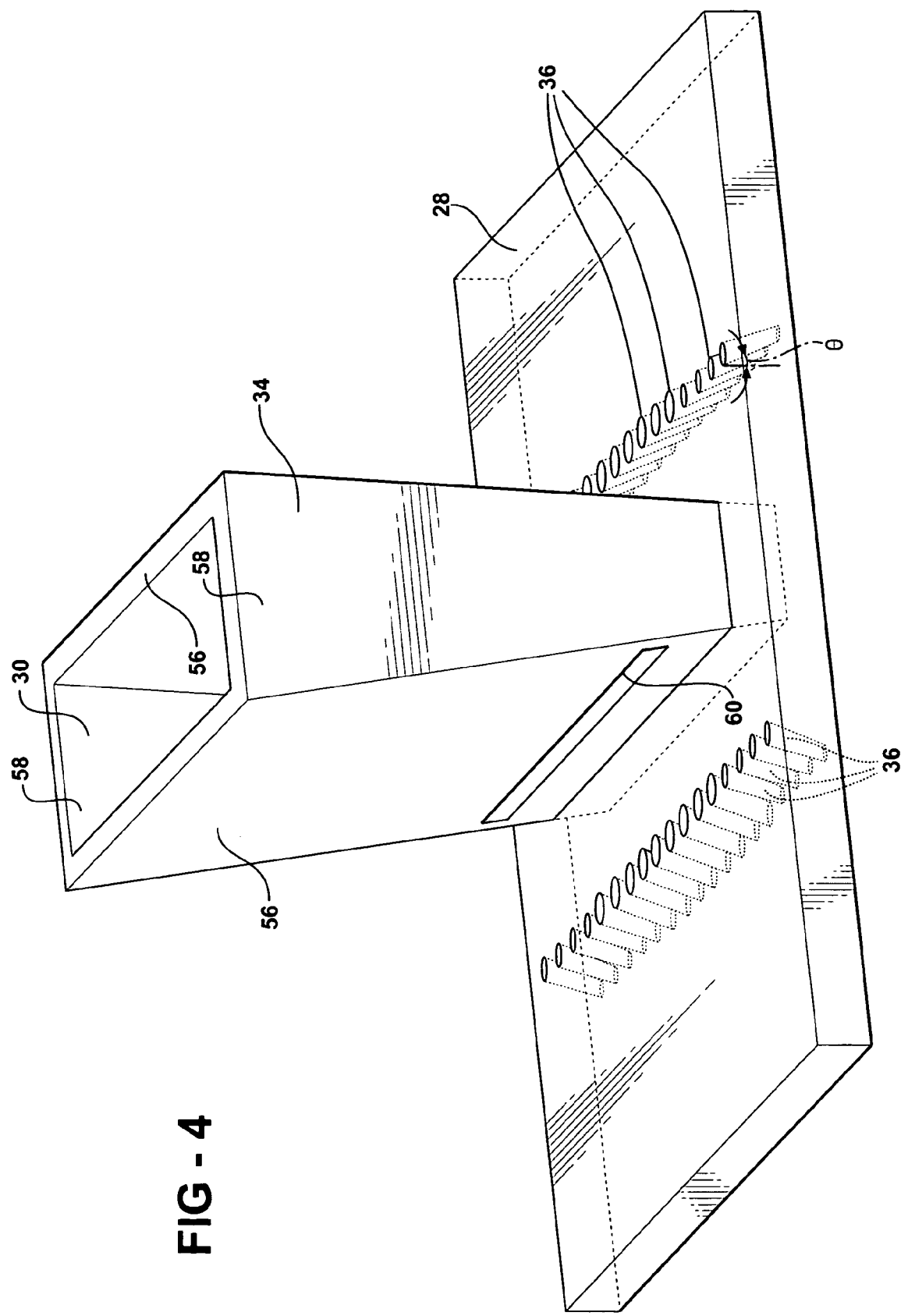
FIG. 4 is a perspective view of the nozzle plate and secondary nozzles of the embodiment of FIG. 3.
Figure 5:
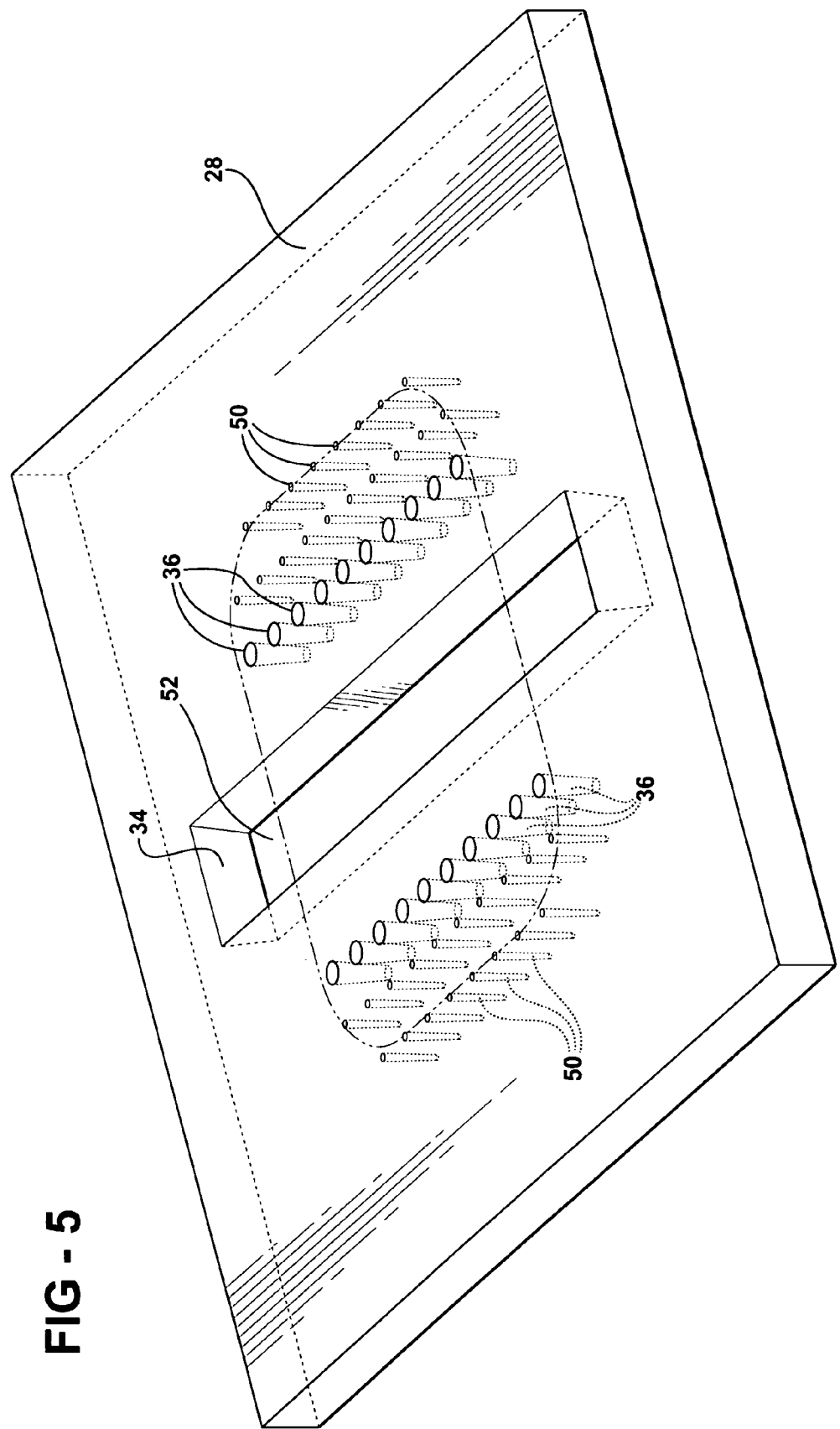
FIG. 5 is a perspective view of the nozzle plate of the embodiment of FIG. 3 showing tertiary nozzles.
Figure 6:
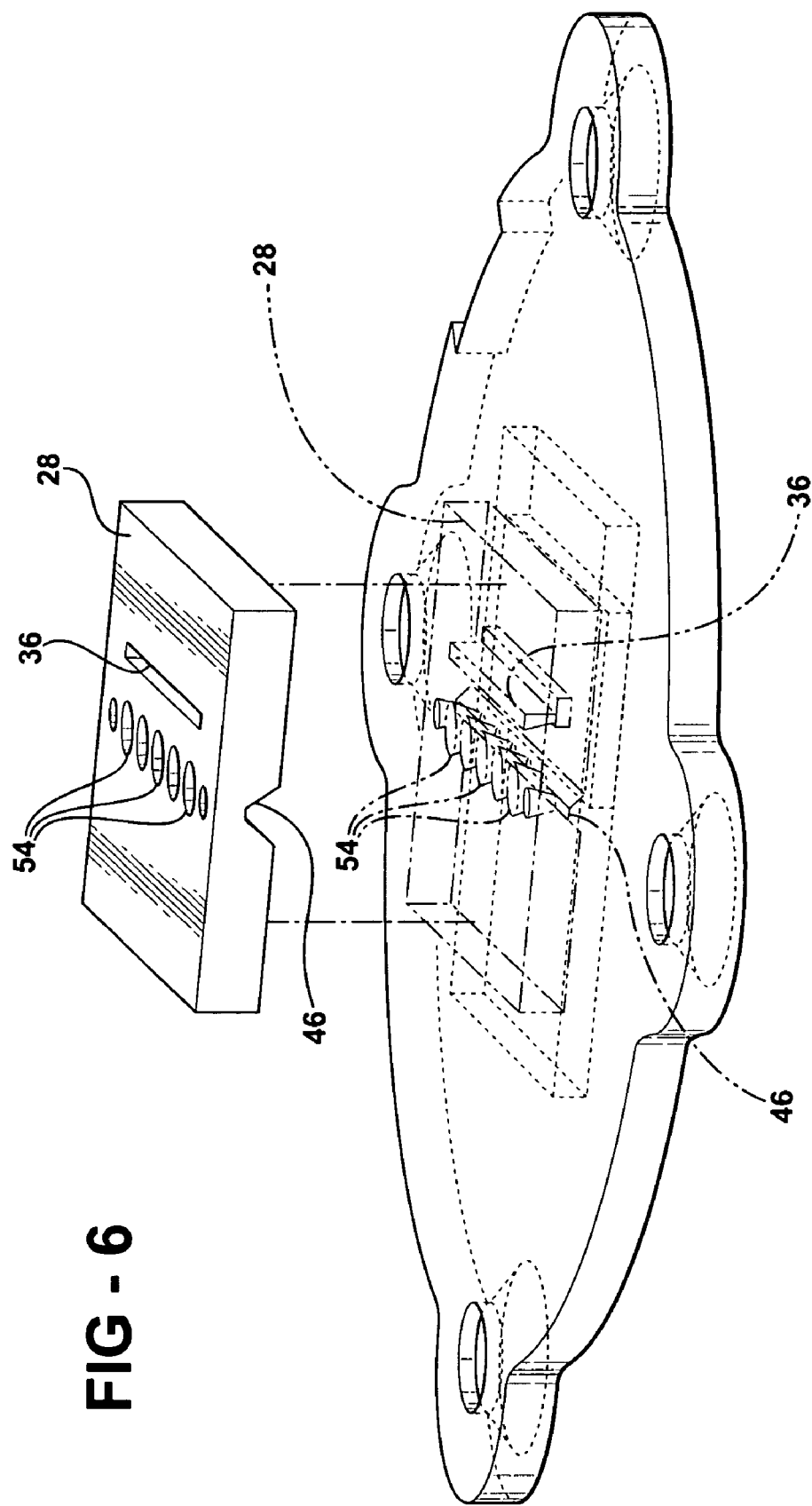
FIG. 6 is an exploded view of the housing and nozzle plate of the embodiment of FIG. 3 showing the primary nozzle comprising an array of conical bores and the secondary nozzles comprising an elongated slot.

Referring to the Figures, wherein like numerals indicate corresponding parts throughout the several views, two embodiments of a heat exchanger assembly for cooling an electronic device are shown respectively in FIGS. 1 and 3. The assembly comprises a housing 20 having a top 21 and a bottom 22. In addition, the assembly includes a plurality of high fins 24, a plurality of low fins 26, a nozzle plate 28, an inlet 30, at least one outlet 32, a primary nozzle 34, and a plurality of secondary nozzles 36.

The bottom 22 of the housing 20 engages the electronic device, as well known in the art. The top 21 of the housing 20 extends from the bottom 22 and encloses the other parts of the assembly. The housing 20 has a center 38. A plurality of high fins 24 extends upwardly from the bottom 22 of the housing 20 to upper extremities at a high height. A plurality of low fins 26 extends upwardly from the bottom 22 of the housing 20 to upper extremities at a low height. The upper extremities of the high fins 24 are higher than the upper extremities of the low fins 26. In other words, the high fins 24 are taller than the low fins 26. The high fins 24 and low fins 26 are aligned outwardly from the center 38 and are spaced from the center 38 such that the low fins 26 are closer to the center 38 than the high fins 24. In the alternative, the plurality of high fins 24 and plurality of low fins 26 can be replaced with a plurality of fins 24, 26 of equal height aligned outwardly from the center 38. Additionally, a plurality of fins 24, 26 of several heights can be aligned outwardly from the center 38 in a fashion similar to that of the high fins 24 and low fins 26 previously mentioned.

A nozzle plate 28 with an upper surface and a lower surface is disposed within the housing 20. The nozzle plate 28 also contains a center axis 40 that is included in the center 38 of the housing 20. The nozzle plate 28 extends across the center 38 of the housing 20 and is positioned above the high fins 24 and low fins 26 and below the top 21 of the housing 20. In this position, the nozzle plate 28 and the bottom 22 of the housing 20 define a fin chamber 42 below the lower surface of the nozzle plate 28. Additionally, the nozzle plate 28 and the top 21 of the housing 20 define a fluid chamber 44 above the upper surface of the nozzle plate 28. An inlet 30 is disposed into the housing 20 to supply the cooling fluid to the fluid chamber 44, the nozzle plate 28, and the fin chamber 42. The fluid chamber 44 contains some of the cooling fluid supplied by the inlet 30. The remaining cooling fluid as well as the high fins 24 and low fins 26 are contained in the fin chamber 42.

At least one outlet 32 is disposed outwardly of the high fins 24 and low fins 26. The outlet 32 receives the cooling fluid after it passes from the inlet 30 and through the high fins 24 and low fins 26 in the fin chamber 42. The outlet 32 then removes the cooling fluid from the assembly.

A primary nozzle 34 is disposed in the nozzle plate 28, at the center 38 of the housing 20 and over the electronic device. The primary nozzle 34 receives the cooling fluid from the inlet 30 and delivers the cooling fluid through the nozzle plate 28 to the fin chamber 42. Directly under the primary nozzle 34, the heat transfer rate is at a high level. This high heat transfer rate is due to the high temperature of the electronic device and the impingement cooling caused by the high velocity delivery of the cooling fluid. The primary nozzle 34 also directs the flow of the cooling fluid outwardly from the center 38 through the high fins 24 and low fins 26.

Optionally, the primary nozzle 34 can extend along the center axis 40 of the nozzle plate 28 and into the nozzle plate 28 with the primary nozzle 34 exiting at an expansion notch 46. In this case, the primary nozzle 34 does not extend through the entire thickness of the nozzle plate 28. Rather, it extends until it reaches the expansion notch 46. The expansion notch 46 is disposed in the nozzle plate 28 directly beneath the primary nozzle 34 and diverges from the exit of the primary nozzle 34 through the nozzle plate 28. The expansion notch 46 beneath the primary nozzle 34 allows the impingement jets of cooling fluid to expand as the jets exit the primary nozzle 34.

A plurality of secondary nozzles 36 is disposed in the nozzle plate 28. The secondary nozzles 36 are aligned outwardly of the primary nozzle 34 and the center axis 40 of the nozzle plate 28. The disposition and alignment of the secondary nozzles 36 distinguishes the invention. The secondary nozzles 36 direct the flow of the cooling liquid outwardly of the primary nozzle 34 from the center 38. Each of the secondary nozzles 36 defines a conical bore that extends from the upper surface of the nozzle plate 28 to the lower surface of the nozzle plate 28. The opening of the conical bore at the upper surface of the nozzle plate 28 is larger than the opening at the lower surface of the nozzle plate 28 thus creating a funnel shape. The conical bores allow the cooling fluid to move from the fluid chamber 44, through the nozzle plate 28 and into the fin chamber 42.

Expansion notches 46 can also be disposed the nozzle plate 28 directly beneath the geometric alignment of secondary nozzles 36. In this case, the secondary nozzles 36 are disposed into the nozzle plate 28 where they exit at their respective expansion notch 46. The secondary nozzles 36 do not extend through the entire thickness of the nozzle plate 28. Rather, they extend until they reach the expansion notch 46. The expansion notches 46 are disposed in the nozzle plate 28 directly beneath the geometric alignment of secondary nozzles 36 and diverge from the exits of the secondary nozzles 36 through the nozzle plate 28. The expansion notches 46 beneath the geometric alignment of secondary nozzles 36 allow the impingement jets of cooling fluid to expand as the jets exit the secondary nozzles 36.

Figure 7:
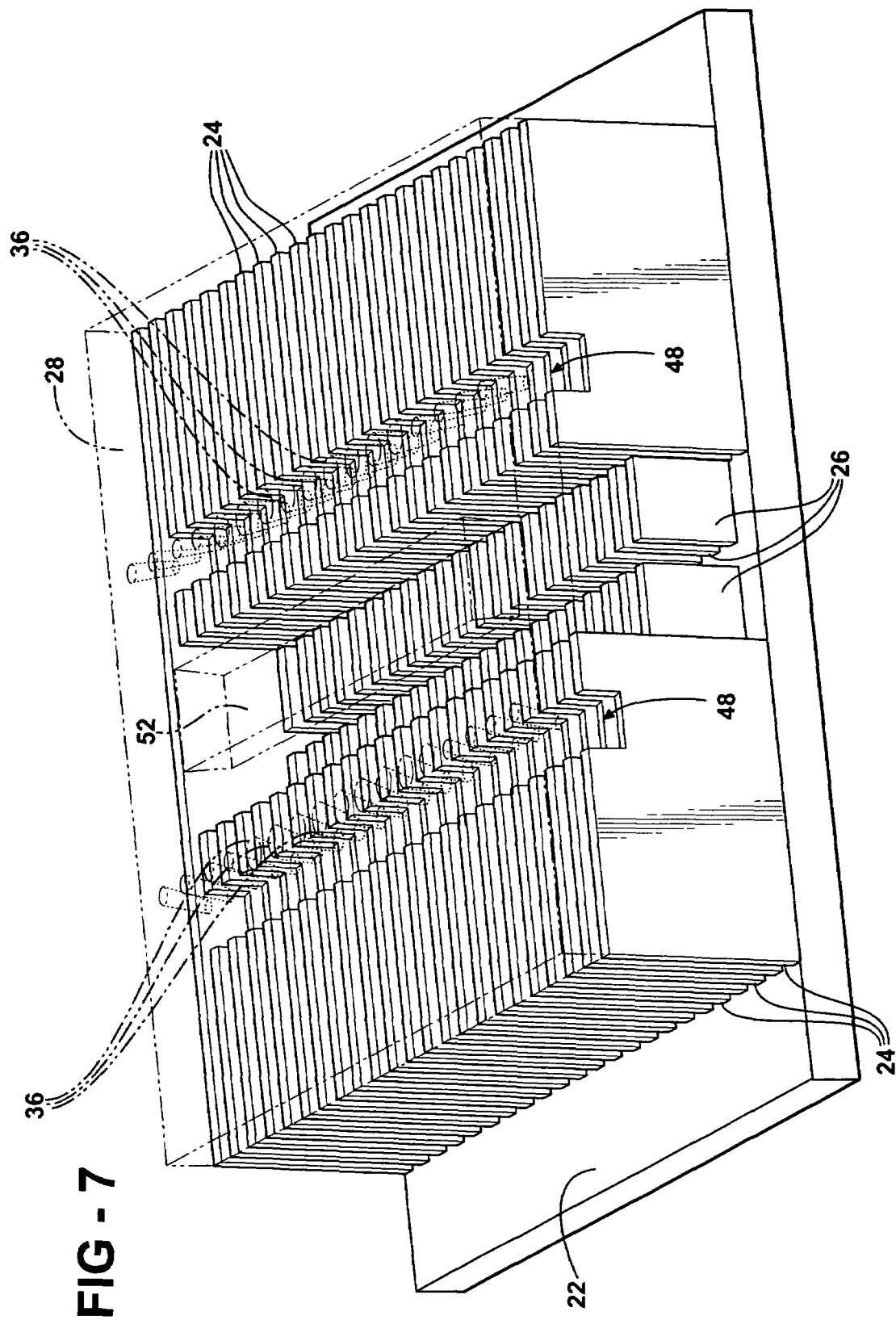
FIG. 7 is a perspective view of the fins and nozzle plate of the embodiment of FIG. 3 showing the primary nozzle as an elongated slot and the secondary nozzles angled outwardly.
Figure 8:
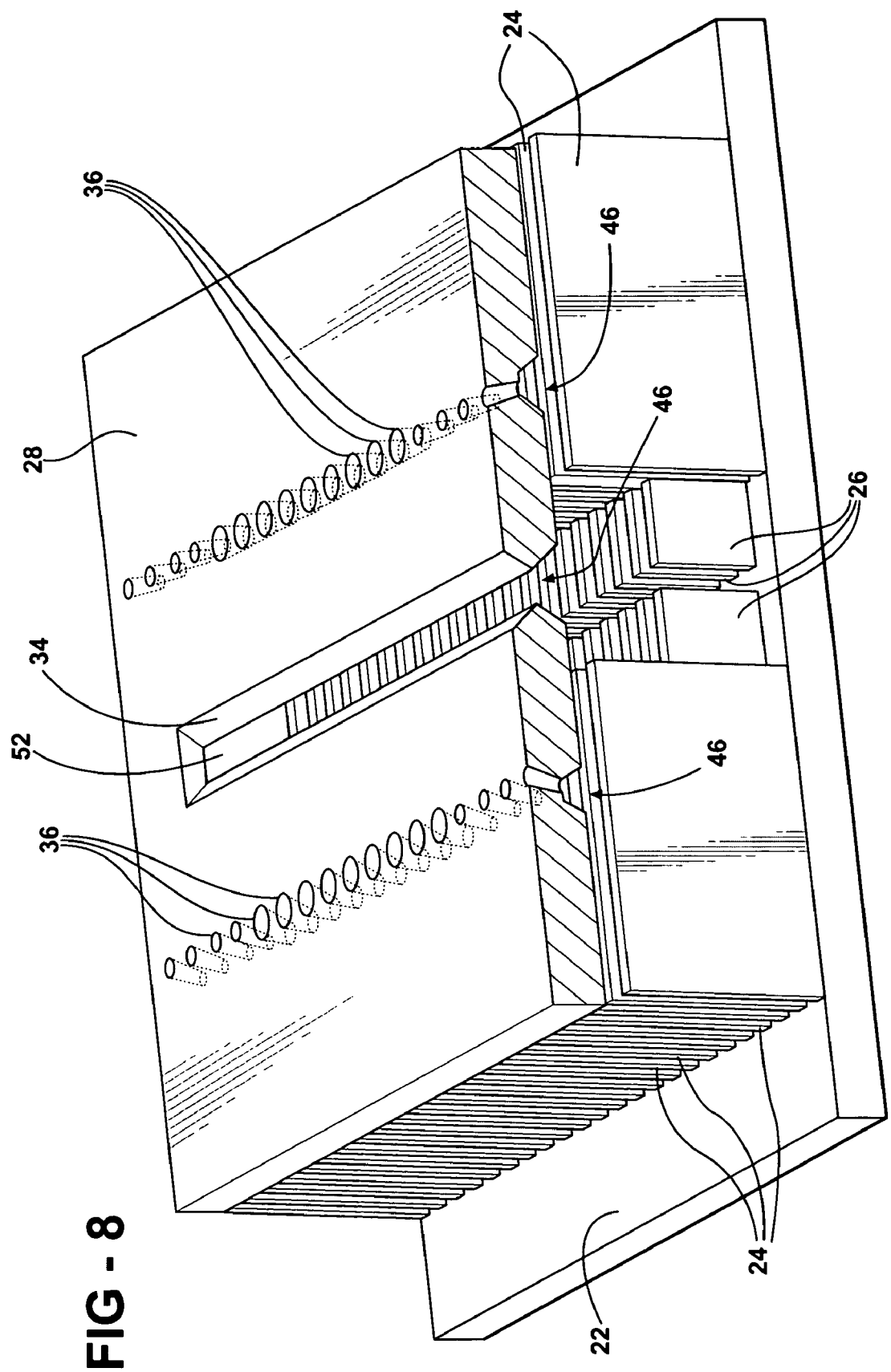
FIG. 8 is a perspective view of the fins and nozzle plate of the embodiment of FIG. 3 showing the primary nozzle as an elongated slot and the secondary nozzles angled outwardly and a plurality of expansion notches.
Figure 9:
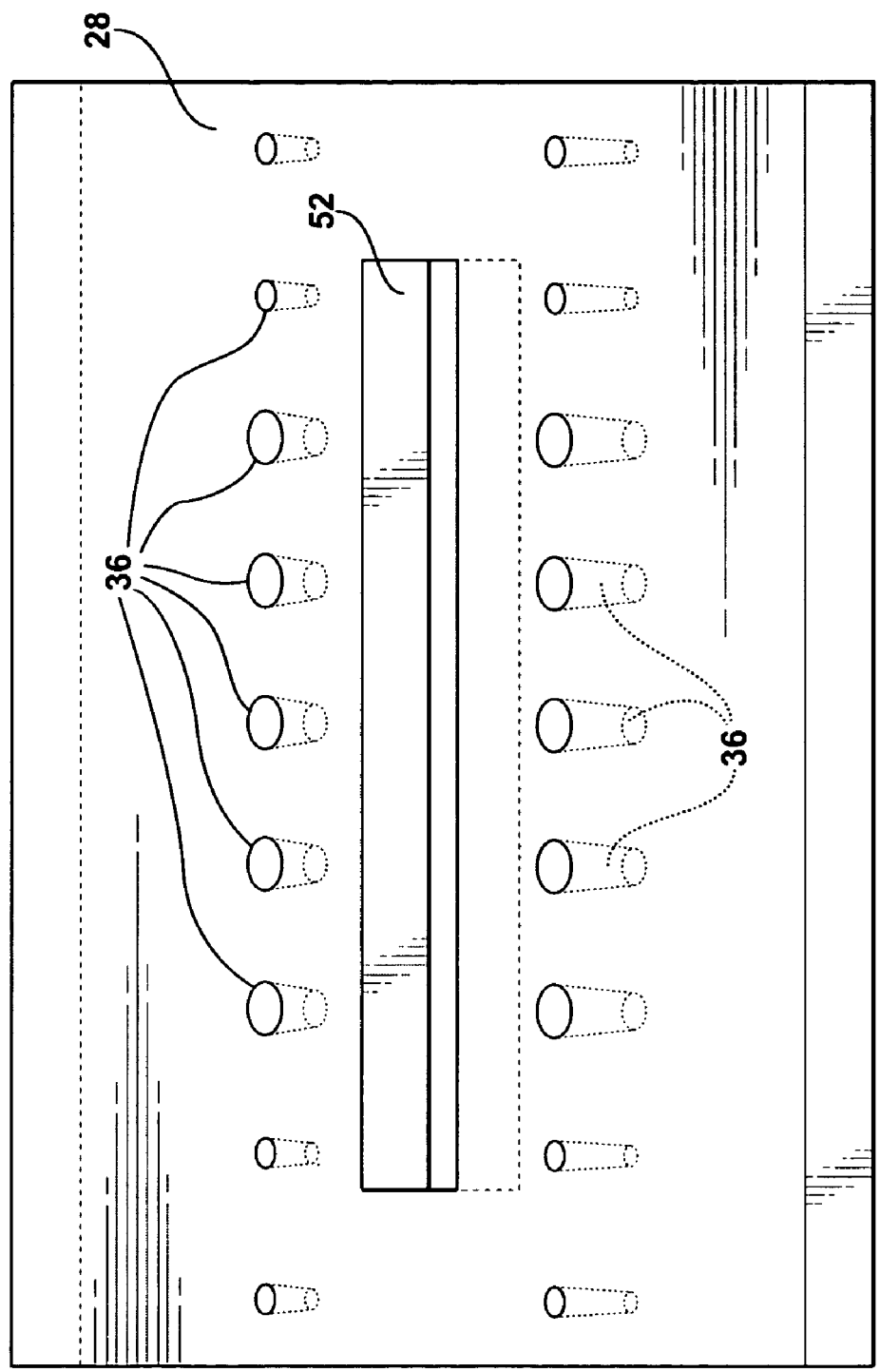
FIG. 9 is a perspective view of the nozzle plate of the embodiment of FIG. 3 showing the primary nozzle as an elongated slot and the secondary nozzles having varying areas at the bottom of the nozzle plate.

The expansion of the impingement jet of cooling fluid can also be achieved via implementation of an expansion recess 48 disposed in the plurality of fins 24, 26 directly beneath the geometric alignment of secondary nozzles 36. A section is disposed in each fin directly beneath the respective geometric alignment of secondary nozzles 36, thus forming the expansion recess 48. In the embodiment shown in FIG. 7, the section is rectangular in shape and yields and expansion recess 48 that is rectangular as it extends beneath the rows of secondary nozzles 36. Expansion notches 46 are not necessary if expansion recesses 48 are used, and vice versa.

Alternatively, at least one of the secondary nozzles 36 could be angled outwardly at an angle Θ to facilitate unidirectional flow of the cooling fluid without opposing the flow from the primary nozzle 34. In this case, the conical bore would be angled as well.

The secondary nozzles 36 are geometrically aligned with one another. For example, in the first embodiment shown in FIG. 1, the secondary nozzles 36 are aligned in a circle. In the second embodiment shown in FIG. 3, the secondary nozzles 36 are aligned in rows. The secondary nozzles 36 are equally spaced from one another in their respective geometric alignment. The space $S_s$ between secondary nozzles 36 is related to the diameter $d_s$ of the secondary nozzle 36 measured at the lower surface of the nozzle plate 28. As the diameter $d_s$ increases, the space $S_s$ between two secondary nozzles 36 decreases. The recommended range for the space $S_s$ is: $2d_s < S_s < 8d_s$.

Additionally, a plurality of tertiary nozzles 50 is disposed in the nozzle plate 28 outwardly of the secondary nozzles 36. The tertiary nozzles 50 also direct the cooling fluid into the fin chamber 42. The tertiary nozzles 50 perform a function similar to that of the secondary nozzles 36. However, the tertiary nozzles 50 direct the cooling fluid outwardly of the secondary nozzles 36 and the primary nozzle 34 from the center 38 thus concentrating their output on high fins 24 and low fins 26 farther out from the center 38. Like the secondary nozzles 36, the tertiary nozzles 50 are geometrically aligned with one another. The tertiary nozzles 50 are also equally spaced from one another in their respective geometric alignment. The space $S_t$ between tertiary nozzles 50 is related to the diameter $d_t$ of the tertiary nozzle 50 measured at the lower surface of the nozzle plate 28. The recommended range for the space $S_t$ is: $2d_t < S_t < 8d_t$. Additionally, at least one of the tertiary nozzles 50 could be angled outwardly at the angle $\Theta'$.

One of the primary nozzles 34 and the secondary nozzles 36 defines an elongated slot 52 extending through the nozzle plate 28 while the other of the primary nozzle 34 and secondary nozzles 36 defines a plurality of conical bores extending through the nozzle plate 28. In other words, either the primary nozzle 34 or the secondary nozzles 36 can be elongated to form a slot.

In the first embodiment shown in FIG. 1, the housing 20 and the nozzle plate 28 are circular in shape. The inlet 30 enters the housing 20 at the center 38 of the housing 20. Two outlets 32 are disposed across from each other on opposite sides of the circular housing 20 with the inlet 30 equidistant from each of the outlets 32. In other words, the inlet 30 and both outlets 32 are positioned along a single line with the inlet 30 being the midpoint and the outlets 32 being the endpoints.

A plurality of low fins 26 extend radially from the center 38 and are spaced radially from the center 38 and radially outward of the center 38. Similarly, a plurality of high fins 24 extend radially from the center 38 and radially outward of the center 38. The high fins 24 and low fins 26 are aligned outwardly from the center 38 and are spaced from the center 38 such that the low fins 26 are closer to the center 38 than the high fins 24. The nozzle plate 28 extends across the center 38 of the housing 20 and forms a fluid chamber 44 and a fin chamber 42, both circular in shape. The primary nozzle 34 is disposed at the center 38 of the nozzle plate 28 and defines four conical bores centered on the center axis 40 of the nozzle plate 28. The conical bore openings at the upper surface of the nozzle plate 28 overlap to form a shape similar to a four leaf clover, except that the edges are rounded. The conical bore openings at the lower surface of the nozzle plate 28 do not overlap thus leaving four circular exits centered on the center axis 40 of the nozzle plate 28.

The secondary nozzles 36 are spaced equally and aligned in a circular pattern around the center 38. The number $n_s$ of the secondary nozzles 36 aligned in the circular pattern is related to the diameter $D_s$ of the circle, the space $S_s$ between next adjacent secondary nozzles 36, and the diameter $d_s$ at the lower surface of the nozzle plate 28 of the secondary nozzles 36 by the equation: $n_s = \pi \times D_s \div (S_s + d_s)$. As the diameter $D_s$ of the circle increases, the number $n_s$ of secondary nozzles 36 in that circle also increases. However, as the diameter $d_s$ at the lower surface of the nozzle and the space $S_s$ between next adjacent secondary nozzles 36 increase, the number $n_s$ of secondary nozzles 36 in the respective circle decreases. The recommended range for the space $S_s$ between next adjacent secondary nozzles 36 is: $2d_s < S_s < 8d_s$. The secondary nozzles 36 are angled outwardly at the angle $\Theta$.

The first embodiment also includes a plurality of tertiary nozzles 50 which are spaced equally and aligned in a circular pattern around the center 38 outwardly of the secondary nozzles 36. In other words, the tertiary nozzles 50 form a concentric circle centered on the center 38 and outwardly of the circular pattern created by the secondary nozzles 36. The number $n_t$ of tertiary nozzles 50 in the respective circle is also governed by the equation: $n_t = \pi \times D_t \div (S_t + d_t)$. Similarly, the recommended range for the space $S_t$ between next adjacent secondary nozzles 36 is: $2d_t < S_t < 8d_t$. Additionally, the tertiary nozzles 50 are angled outwardly at the angle $\Theta'$.

In the second embodiment shown in FIG. 3, the housing 20 and the nozzle plate 28 are rectangular in shape. The inlet 30 enters the housing 20 at the center 38 of the housing 20. Two outlets 32 are disposed across from each other on opposite sides of the rectangular housing 20. The nozzle plate 28 extends across the center 38 of the housing 20 and forms a fluid chamber 44 and a fin chamber 42, both rectangular in shape. The primary nozzle 34 is disposed at the center 38 of the nozzle plate 28. The primary nozzle 34 is elongated and defines an elongated slot 52. The primary nozzle 34 extends through the center axis 40 of the nozzle plate 28 and into the fin chamber 42. Alternatively, the elongated nozzle can comprise an array of nozzles 54 with each nozzle defining a conical bore.

The primary nozzle 34 in the second embodiment includes converging side walls 56 and end walls 58 that extend from the inlet 30 and through the nozzle plate 28. Additionally, the primary nozzle 34 defines a secondary slot 60 in each of the side walls 56. The secondary slots 60 apportion an amount of cooling liquid to the secondary nozzles 36 and tertiary nozzles 50 and deliver that amount of cooling fluid into the fluid chamber 44. The secondary slots 60 are positioned below the housing 20 and above the nozzle plate 28. The primary nozzle 34 in the second embodiment delivers cooling fluid to both the fluid chamber 44 and the fin chamber 42.

A plurality of low fins 26 and high fins 24 is disposed outwardly of the primary nozzle 34 forming a rectangular shape. The low fins 26 and high fins 24 extend perpendicularly from the side walls 56 of the primary nozzle 34. The high fins 24 and low fins 26 are aligned outwardly from the side walls 56 of the primary nozzle 34 and are spaced from the primary nozzle 34 such that the low fins 26 are closer to the primary nozzle 34 than the high fins 24.

The secondary nozzles 36 in the second embodiment are spaced equally and aligned in a pattern of rows parallel to the side walls 56 of the primary nozzle 34. The rows are aligned outwardly of the primary nozzle 34 in opposite directions creating a row on each side of the primary nozzle 34. The secondary nozzles 36 are angled outwardly at the angle $\Theta$. The openings at the lower surface of the nozzle plate 28 of the secondary nozzles 36 define respective areas that vary from secondary nozzle 36 to secondary nozzle 36. In other words, the secondary nozzle 36 openings at the lower surface of the nozzle plate 28 in each row are not the same size.

Alternatively, the openings at the lower surface of the nozzle plate 28 of the secondary nozzles 36 rows could define respective equal areas. Also in the alternative, the secondary nozzles 36 could be angled perpendicularly to the nozzle plate 28, not angled outwardly.

Also, a plurality of tertiary nozzles 50 could be disposed in a pattern of rows. The tertiary nozzles 50 would be aligned outwardly of and parallel to the rows of secondary nozzles 36 creating a plurality of rows outward of each secondary row. The tertiary nozzles 50 would be disposed perpendicularly to the nozzle plate 28. The openings at the lower surface of the nozzle plate 28 of the secondary nozzles 36 rows would define respective equal areas.

Obviously, many modifications and variations of the present invention are possible in light of the above teachings. The invention may be practiced otherwise than as specifically described within the scope of the appended claims.

What is claimed is:

1. A heat exchanger for cooling an electronic device comprising;
   a housing having a center and a top and a bottom for engaging said electronic device,
   a plurality of fins extending upwardly from said bottom to upper extremities and extending from and spaced from center,
      a nozzle plate in said housing comprising an upper surface and a lower surface and extending across said center and above said fins and below said top to define a fin chamber below and a fluid chamber above,
      an inlet into said housing at said center for supplying the cooling fluid to said fluid chamber and said nozzle plate,
      a primary nozzle for delivering the cooling fluid from said inlet and through said nozzle plate to said fin chamber for flow from said center between said fins,
      at least one outlet disposed outwardly of said fins for receiving the cooling fluid from said fins, and
      a plurality of secondary nozzles in said nozzle plate and disposed outwardly of said primary nozzle from said center for directing the cooling fluid into said fin chamber outwardly of said primary nozzle from said center;
   wherein said center includes a center axis extending perpendicularly to said upper surface and said lower surface of said nozzle plate;
   wherein said primary nozzle is elongated and extends through said center axis of said nozzle plate; and
   wherein said primary nozzle includes converging side walls and end walls extending from said inlet and through said nozzle plate and defines a secondary slot in each of said side walls and positioned below said housing and above said nozzle plate for delivering the cooling fluid into said fluid chamber.

2. An assembly as set forth in claim 1 wherein said secondary nozzles are disposed in a pattern of rows parallel to said side walls of said primary nozzle.

3. An assembly as set forth in claim 2 wherein said openings at said lower surface of said nozzle plate of said secondary nozzles define respective equal areas.

4. An assembly as set forth in claim 2 wherein said openings at said lower surface of said nozzle plate of said secondary nozzles define respective areas that vary from secondary nozzle to secondary nozzle.

5. An assembly as set forth in claim 2 including a plurality tertiary nozzles disposed in a pattern of rows outwardly of said rows of said secondary nozzles and parallel to said rows of said secondary nozzles and said elongated primary nozzle for directing the cooling fluid into said fin chamber outwardly of said secondary nozzles and said primary nozzle and said center.

* * * * *